United States Patent
Wood et al.

(10) Patent No.: US 7,892,911 B2
(45) Date of Patent: Feb. 22, 2011

(54) METAL GATE ELECTRODES FOR REPLACEMENT GATE INTEGRATION SCHEME

(75) Inventors: Bingxi Sun Wood, Cupertino, CA (US); Chorng-Ping Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 35 days.

(21) Appl. No.: 11/972,439

(22) Filed: Jan. 10, 2008

(65) Prior Publication Data

US 2009/0179285 A1    Jul. 16, 2009

(51) Int. Cl.
H01L 21/8238 (2006.01)

(52) U.S. Cl. ............... 438/206; 257/E29.158; 257/412

(58) Field of Classification Search .......... 257/412, 257/E29.158; 438/206
See application file for complete search history.

(56) References Cited

U.S. PATENT DOCUMENTS

| | | | |
|---|---|---|---|
| 2004/0137688 A1 | 7/2004 | Chang et al. | |
| 2005/0269644 A1 | 12/2005 | Brask et al. | |
| 2006/0008968 A1* | 1/2006 | Brask et al. | 438/206 |
| 2006/0046399 A1 | 3/2006 | Lindert et al. | |
| 2006/0121678 A1* | 6/2006 | Brask et al. | 438/287 |
| 2006/0278934 A1* | 12/2006 | Nagahama | 257/369 |
| 2007/0126067 A1 | 6/2007 | Hattendorf et al. | |

* cited by examiner

*Primary Examiner*—Thao X Le
*Assistant Examiner*—Elias Ullah
(74) *Attorney, Agent, or Firm*—Blakely Sokoloff Taylor & Zafman

(57) ABSTRACT

Metal gate electrodes for a replacement gate integration scheme are described. A semiconductor device includes a substrate having a dielectric layer disposed thereon. A trench is disposed in the dielectric layer. A gate dielectric layer is disposed at the bottom of the trench and above the substrate. A gate electrode has a work-function-setting layer disposed along the sidewalls of the trench and above the gate dielectric layer at the bottom of the trench. The work-function-setting layer has a thickness at the bottom of the trench greater than the thickness along the sidewalls of the trench. A pair of source and drain regions is disposed in the substrate, on either side of the gate electrode.

7 Claims, 5 Drawing Sheets

METAL GATE ELECTRODES FOR REPLACEMENT GATE INTEGRATION SCHEME

BACKGROUND OF THE INVENTION

1) Field of the Invention

The invention is in the fields of Semiconductor Devices and Semiconductor Processing.

2) Description of Related Art

For the past several decades, the scaling of features in integrated circuits has been the driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity. Scaling has not been without consequence, however. As the dimensions of the fundamental building blocks of microelectronic circuitry are reduced and as the sheer number of fundamental building blocks fabricated in a given region is increased, the performance requirements of the materials used in these building blocks have become exceedingly demanding. One example is the change from poly-crystalline silicon to metal gate electrodes in complimentary metal-oxide-semiconductor (CMOS) transistors, starting at around the 45 nm technology node.

Metal gate electrodes for CMOS transistors can be fabricated in a replacement gate integration scheme. However, as constraints on dimensions increase, problems may arise with conventional approaches. For example, FIGS. 1A-1C illustrate cross-sectional views representing steps in a conventional replacement gate integration scheme, in accordance with the prior art.

Referring to FIG. 1A, a partially completed semiconductor device 100 is formed in and above a substrate 102. Source and drain regions 104 define a channel region 106 in substrate 102 and underneath a gate dielectric layer 108. A trench 110 is formed in a dielectric layer 112 and, in particular, in between a pair of dielectric spacers 114. A gate electrode for semiconductor device 100 may ultimately be formed in trench 110.

In a replacement gate integration scheme, the gate electrode is formed by depositing a metal layer over a partially completed semiconductor device to fill at least a portion of a trench 110. Referring to FIG. 1B, a gate electrode is formed by depositing a metal layer 116 over partially completed semiconductor device 100 to fill a portion of trench 110. However, metal layer 116 may be pinched-off at the top of trench 110 prior to completion of the filling of trench 110. Hence, a void 120 may undesirably be formed within trench 110, as depicted in FIG. 1B.

Referring to FIG. 1C, metal layer 116 has been planarized to form a planarized metal layer 118, exposing void 120 formed within trench 110. Void 120 may undesirably collect residue from processing steps, such as slurry residue from a chemical-mechanical polishing step used to planarize metal layer 116. The inclusion of such residue may interfere with subsequent process steps and, if retained in a completed semiconductor device, may impact the performance or function of the completed semiconductor device.

Thus, metal gate electrodes for a replacement gate integration scheme are described herein.

DETAILED DESCRIPTION

Figure 1A:
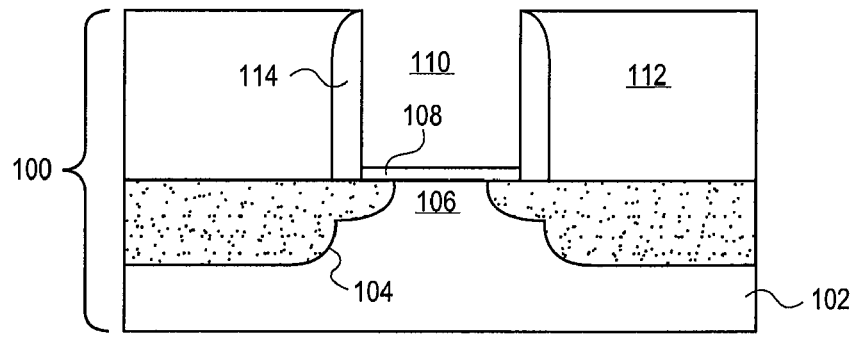
FIGS. 1A-1C illustrate cross-sectional views representing steps in a conventional replacement gate integration scheme, in accordance with the prior art.
Figure 1B:
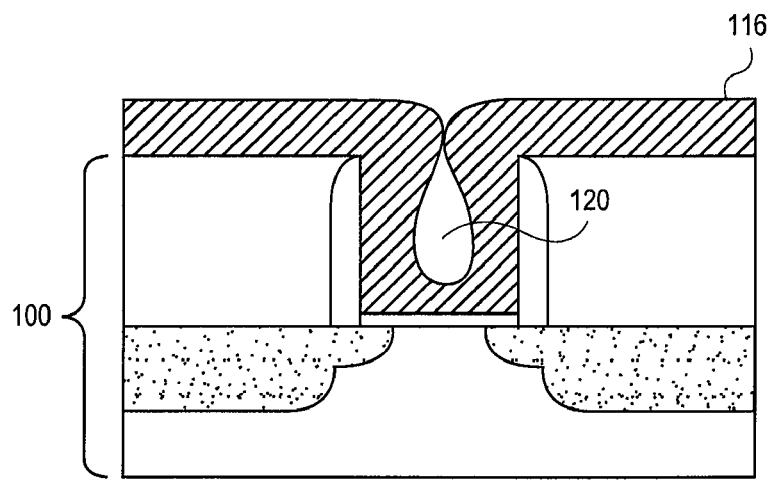
Figure 1C:
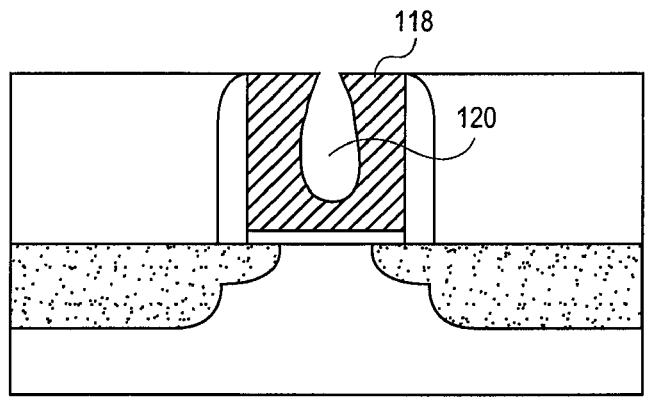

Metal gate electrodes for a replacement gate integration scheme are described. In the following description, numerous specific details are set forth, such as fabrication conditions and material regimes, in order to provide a thorough understanding of the present invention. It will be apparent to one skilled in the art that the present invention may be practiced without these specific details. In other instances, well-known features, such as integrated circuit design layouts, are not described in detail in order to not unnecessarily obscure the present invention. Furthermore, it is to be understood that the various embodiments shown in the Figures are illustrative representations and are not necessarily drawn to scale.

Disclosed herein are metal gate electrodes for a replacement gate integration scheme. A semiconductor device may include a substrate having a dielectric layer disposed thereon. In accordance with an embodiment of the present invention, a trench is disposed in the dielectric layer. A gate dielectric layer is disposed at the bottom of the trench and above the substrate. In one embodiment, a gate electrode has a work-function-setting layer disposed along the sidewalls of the trench and above the gate dielectric layer at the bottom of the trench. The work-function-setting layer has a thickness at the bottom of the trench greater than the thickness along the sidewalls of the trench. A pair of source and drain regions may be disposed in the substrate, on either side of the gate electrode. In one specific embodiment, the portion of the work-function-setting layer disposed along the sidewalls of the trench is directly adjacent to the sidewalls of the trench. In another specific embodiment, the gate dielectric layer is further disposed along the sidewalls of the trench and the portion of the work-function-setting layer disposed along the sidewalls of the trench is adjacent to the gate dielectric layer.

The use of a metal gate electrode having a work-function-setting layer with a thickness at the bottom of a replacement gate trench greater than the thickness along the sidewalls of the trench may enable the filling of very narrow trenches. For example, in accordance with an embodiment of the present invention, a metal-containing material layer is deposited in a trench formed by a replacement gate integration scheme. The thickness of the metal-containing material layer at the bottom of the trench is greater than the thickness along the sidewalls of the trench. In one embodiment, this arrangement enables the incorporation at the bottom of the trench of an amount of the metal-containing material layer sufficient to set the work-function of a semiconductor device. Meanwhile, the amount of the metal-containing material layer formed along the sidewalls of the trench is sufficiently thin to inhibit pinching-off of the metal-containing material layer at the top of the trench and to enable filling of the remainder of the trench with a single or with multiple conductive fill materials. In a specific embodiment, the metal-containing material layer is formed in two distinct process operations: the first operation includes an atomic layer deposition of a first work-function-setting film and the second operation includes a physical vapor deposition of a second work-function-setting film. In a particular embodiment, the first work-function-setting film is formed to a thickness sufficiently thick to protect a gate dielectric layer during the forming of the second work-function-setting film, but sufficiently thin for the second work-function-setting film to contribute to the work-function of a gate electrode.

Figure 2:
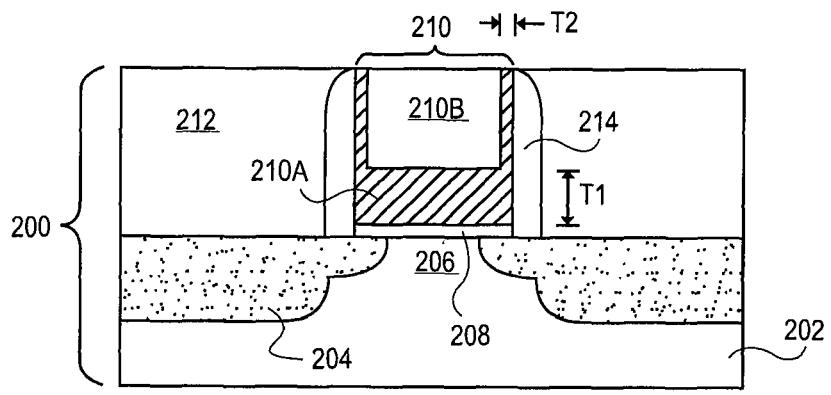
FIG. 2 illustrates a cross-sectional view representing a semiconductor device having a metal gate electrode with a work-function-setting layer disposed along the sidewalls of a trench and above a gate dielectric layer at the bottom of the trench, in accordance with an embodiment of the present invention.

A metal gate electrode may be incorporated into a semiconductor device. FIG. 2 illustrates a cross-sectional view representing a semiconductor device having a metal gate electrode with a work-function-setting layer disposed along the sidewalls of a trench and above a gate dielectric layer at the bottom of the trench, in accordance with an embodiment of the present invention.

Referring to FIG. 2, a semiconductor device 200 is formed in and above a substrate 202. Source and drain regions 204 define a channel region 206 in substrate 202 and underneath a gate dielectric layer 208. A gate electrode 210 is disposed in a dielectric layer 212 and, in particular, in between dielectric spacers 214 which define a trench in dielectric layer 212. In accordance with an embodiment of the present invention, gate electrode 210 is composed of a work-function-setting layer 210A and a fill metal layer 210B. Work-function-setting layer 210A is disposed above gate dielectric layer 208 at the bottom of and along the sidewalls of the trench defined by dielectric spacers 214 in dielectric layer 212. Work-function-setting layer 210A has a thickness at the bottom of the trench (T1) greater than the thickness along the sidewalls of the trench (T2). In a specific embodiment, work-function-setting layer 210A has a thickness T1 at the bottom of the trench at least four times greater than its thickness T2 along the sidewalls of the trench. In an embodiment, the portions of work-function-setting layer 210A disposed along the sidewalls of the trench in dielectric layer 212 (as defined by dielectric spacers 214) are directly adjacent to the sidewalls of the trench, as depicted in FIG. 2. In an alternative embodiment, gate dielectric layer 208 is further disposed along the sidewalls of dielectric spacers 214 and the portions of work-function-setting layer 210A disposed along the sidewalls of the trench in dielectric layer 212 are directly adjacent to gate dielectric layer 208.

Work-function-setting layer 210A may be composed of any material and have any thickness T1 at the bottom of the trench suitable to set the work-function of a gate electrode in a semiconductor device. In accordance with an embodiment of the present invention, work-function-setting layer 210A sets at least 95% of the work-function of a gate electrode in a semiconductor device. In a specific embodiment, work-function-setting layer 210A sets the entire work-function of a gate electrode in a semiconductor device. In one embodiment, depending on the specific material composition of work-function-setting layer 210A, the thickness T1 of work-function-setting layer 210A at the bottom of the trench needs to be sufficiently thick to block work-function contribution by any overlying material layers. In a specific embodiment, work-function-setting layer 210A is composed of a material such as, but not limited to, tantalum nitride, tantalum carbide or titanium nitride and has a thickness T1 at the bottom of the trench of at least 2 nanometers. In accordance with an embodiment of the present invention, it is desirable to minimize the thickness T2 along the sidewalls of the trench in order to enable filling of the trench with a conductive fill metal. The thickness T1 of work-function-setting layer 210A at the bottom of the trench may be limited in order to minimize the thickness T2 of work-function-setting layer 210A along the sidewalls of the trench. In one embodiment, work-function-setting layer 210A is composed of a material such as, but not limited to, tantalum nitride, tantalum carbide or titanium nitride and has a thickness T1 at the bottom of the trench of at most 7 nanometers. In a specific embodiment, a different material is used for work-function-setting layer 210A depending if semiconductor device 200 is an N-type device or a P-type device.

Figure 3:
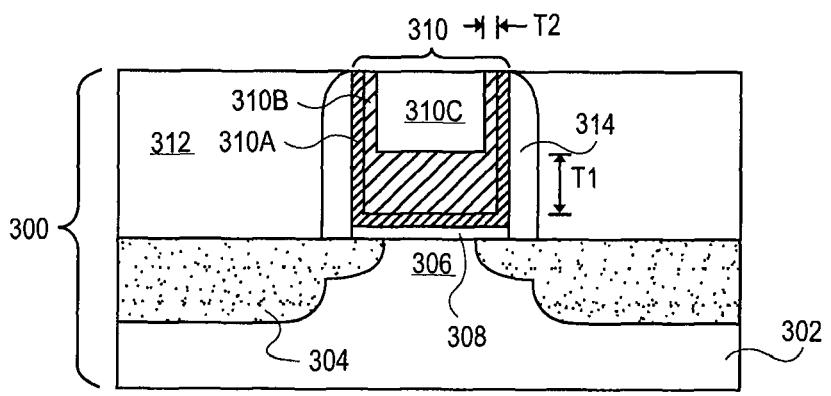
FIG. 3 illustrates a cross-sectional view representing a semiconductor device having a gate electrode with a first work-function-setting film disposed along the sidewalls of a trench and above a gate dielectric layer at the bottom of the trench. A second work-function-setting film is disposed above the first work-function-setting film at the bottom of the trench, in accordance with an embodiment of the present invention.

In accordance with another embodiment of the present invention, FIG. 3 illustrates a cross-sectional view representing a semiconductor device having a gate electrode with a first work-function-setting film disposed along the sidewalls of a trench and above a gate dielectric layer at the bottom of the trench. A second work-function-setting film is disposed above the first work-function-setting film at the bottom of the trench.

Referring to FIG. 3, a semiconductor device 300 is formed in and above a substrate 302. Source and drain regions 304 define a channel region 306 in substrate 302 and underneath a gate dielectric layer 308. A gate electrode 310 is disposed in a dielectric layer 312 and, in particular, in between dielectric spacers 314 which define a trench in dielectric layer 312. Gate electrode 310 is composed of a first work-function-setting film 310A, a second work-function-setting film 310B, and a fill metal layer 310C. First work-function-setting film 310A is disposed along the sidewalls of the trench (defined by dielectric spacers 314 in dielectric layer 312) and at the bottom of the trench, above gate dielectric layer 308. In accordance with an embodiment of the present invention, first work-function-setting film 310A has a thickness at the bottom of the trench substantially equal to its thickness along the sidewalls of the trench, as depicted in FIG. 3. In one embodiment, the portions of first work-function-setting film 310A disposed along the sidewalls of the trench are directly adjacent to the sidewalls of the trench, as depicted in FIG. 3. Second work-function-setting film 310B is disposed at the bottom of the trench above first work-function-setting film 310A. In one embodiment, second work-function-setting film 310B is further disposed along the sidewalls of the trench, adjacent to first work-function-setting film 310A, and has a thickness at the bottom of the trench (T1) greater than the thickness along the sidewalls of the trench (T2), as depicted in FIG. 3. In a particular embodiment, second work-function-setting layer 310B has a thickness T1 at the bottom of the trench at least four times greater than its thickness T2 along the sidewalls of the trench.

In an alternative embodiment, second work-function-setting film 310B is not disposed along the sidewalls of the trench.

Work-function-setting films 310A and 310B may be composed of any material and have any combined thickness at the bottom of the trench suitable to set the work-function of a gate electrode in a semiconductor device. In accordance with an embodiment of the present invention, both work-function-setting film 310A and work-function-setting film 310B contribute to and set at least 95% of the work-function of a gate electrode in a semiconductor device. In a specific embodiment, both work-function-setting film 310A and work-function-setting film 310B contribute to and set the entire work-function of a gate electrode in a semiconductor device. In one embodiment, depending on the specific material compositions of work-function-setting film 310A and work-function-setting film 310B, the combined thickness of work-function-setting films 310A and 310B at the bottom of the trench needs to be sufficiently thick to block work-function contribution by any overlying material layers. In a specific embodiment, work-function-setting films 310A and 310B are composed of materials such as, but not limited to, tantalum nitride, tantalum carbide or titanium nitride and have a combined a thickness at the bottom of the trench of at least 2 nanometers. In a particular embodiment, both work-function-setting film 310A and work-function-setting film 310B are composed of essentially the same material. In an alternative embodiment, work-function-setting film 310A and work-function-setting film 310B are composed of different materials for work-function tuning flexibility. In accordance with an embodiment of the present invention, it is desirable to minimize the combined thickness of work-function-setting films 310A and 310B along the sidewalls of the trench in order to enable filling of the trench with a conductive fill metal. In one embodiment, first work-function-setting film 310A has a thickness of approximately in the range of 1-2 nanometers both at the bottom of the trench and along the sidewalls of the trench. In that embodiment, the thickness T1 of second work-function-setting layer 310B at the bottom of the trench may be limited in order to minimize the thickness T2 of second work-function-setting layer 310B along the sidewalls of the trench. In a specific embodiment, second work-function-setting layer 310B is composed of a material such as, but not limited to, tantalum nitride, tantalum carbide or titanium nitride and has a thickness T1 at the bottom of the trench approximately in the range of 4-6 nanometers.

Figure 4:
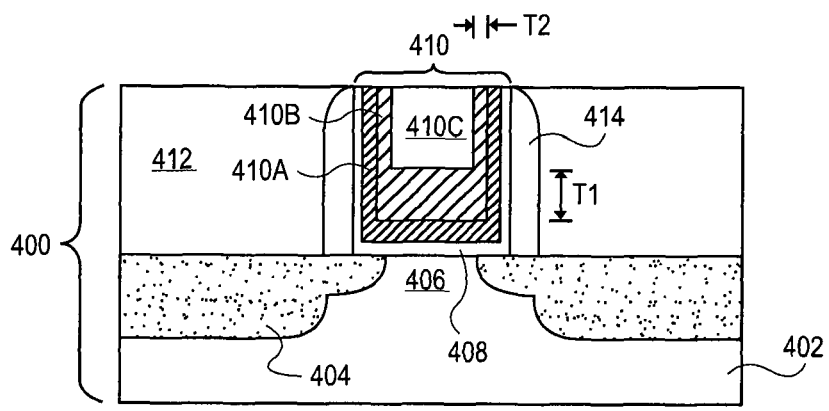
FIG. 4 illustrates a cross-sectional view representing a semiconductor device having a replacement gate dielectric layer. A gate electrode with a first work-function-setting film is disposed above the replacement gate dielectric layer at the bottom of a trench and adjacent to the replacement gate dielectric layer along the sidewalls of the trench. A second work-function-setting film is disposed above the first work-function-setting film at the bottom of the trench, in accordance with an embodiment of the present invention.

In accordance with another embodiment of the present invention, FIG. 4 illustrates a cross-sectional view representing a semiconductor device having a replacement gate dielectric layer. A gate electrode with a first work-function-setting film is disposed above the replacement gate dielectric layer at the bottom of a trench and adjacent to the replacement gate dielectric layer along the sidewalls of the trench. A second work-function-setting film is disposed above the first work-function-setting film at the bottom of the trench.

Referring to FIG. 4, a semiconductor device 400 is formed in and above a substrate 402. Source and drain regions 404 define a channel region 406 in substrate 402 and underneath a gate dielectric layer 408. In accordance with and embodiment of the present invention, gate dielectric layer 408 is further disposed along the sidewalls of dielectric spacers 414, as depicted in FIG. 4. A gate electrode 410 is disposed in a dielectric layer 412 and, in particular, in between the portions of gate dielectric layer 408 disposed along the sidewalls of dielectric spacers 414. Gate electrode 410 is composed of a first work-function-setting film 410A, a second work-function-setting film 410B, and a fill metal layer 410C. First work-function-setting film 410A is disposed above gate dielectric layer 408 at the bottom the trench and beside the portions of gate dielectric layer 408 disposed along the sidewalls of the trench. In one embodiment, first work-function-setting film 410A has a thickness at the bottom of the trench substantially equal to its thickness beside the portions of gate dielectric layer 408 disposed along the sidewalls of the trench, as depicted in FIG. 4. Second work-function-setting film 410B is disposed at the bottom of the trench above first work-function-setting film 410A. In one embodiment, second work-function-setting film 410B is further disposed along the sidewalls of the trench, adjacent to first work-function-setting film 410A, and has a thickness at the bottom of the trench (T1) greater than the thickness along the sidewalls of the trench (T2), as depicted in FIG. 4. In an alternative embodiment, second work-function-setting film 410B is not disposed along the sidewalls of the trench.

First and second work-function-setting films 410A and 410B may have any composition and any dimension as first and second work-function-setting films 310A and 310B, described in association with FIG. 3. Replacement gate dielectric layer 408 may be composed of any material suitable for deposition following removal of a placeholder gate dielectric layer in a replacement gate integration scheme. In one embodiment, replacement gate dielectric layer 408 is composed of a high-k dielectric material such as, but not limited to, hafnium oxide, zirconium oxide, hafnium silicate, hafnium oxy-nitride or lanthanum oxide and has a thickness in approximately in the range of 1-10 nanometers. In a specific embodiment, a thin chemical oxide such as silicon dioxide or silicon oxy-nitride is disposed between substrate 402 and the high-k dielectric material.

A metal gate electrode may be fabricated in a replacement gate integration scheme. FIGS. 5A-5F' illustrate cross-sectional views representing operations in a replacement gate integration scheme incorporating a metal gate electrode, in accordance with an embodiment of the present invention.

Figure 5A:
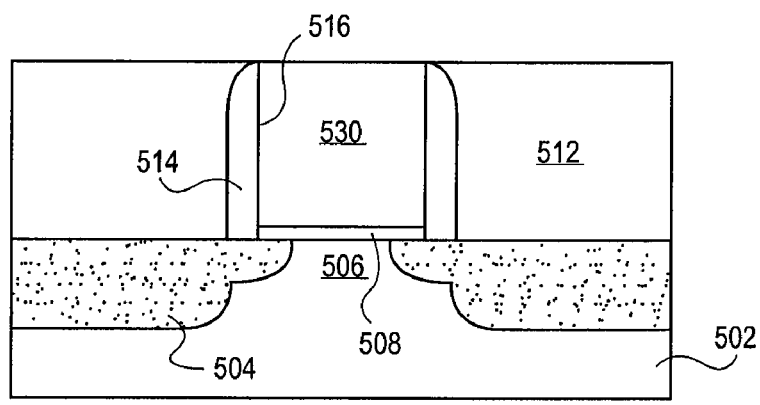
FIGS. 5A-5F' illustrate cross-sectional views representing operations in a replacement gate integration scheme incorporating a metal gate electrode, in accordance with an embodiment of the present invention.

Referring to FIG. 5A, a placeholder gate electrode 530 is disposed above a substrate 502 and in a dielectric layer 512. Source and drain regions 504 define a channel region 506 in substrate 502 on either side of placeholder gate electrode 530. A gate dielectric layer 508 is disposed between placeholder gate electrode 530 and substrate 502. In one embodiment, gate dielectric layer 508 is the gate dielectric layer that will ultimately be retained in a fabricated semiconductor device. In another embodiment, gate dielectric layer 508 is a placeholder gate dielectric layer and will ultimately be replaced by a replacement gate dielectric layer. Dielectric spacers 514 may optionally be incorporated along the sidewalls of placeholder gate electrode 530, as depicted in FIG. 5A.

Substrate 502 may be composed of any material suitable for semiconductor device fabrication. In one embodiment, substrate 502 is a bulk substrate composed of a single crystal of a material which may include, but is not limited to, silicon, germanium, silicon-germanium or a III-V compound semiconductor material. In another embodiment, substrate 502 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 502 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium and a III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, a III-V compound semiconductor material and quartz. Substrate 502 may further include dopant impurity atoms.

Source and drain regions 504 may be formed by implanting dopant impurity atoms into substrate 502. Source and drain regions 504 define channel region 506 in substrate 502, as depicted in FIG. 5A. Source and drain regions 504 may be any regions having the opposite conductivity to channel region 506. For example, in accordance with an embodiment of the present invention, channel region 506 is a P-type doped region and source and drain regions 504 are N-type doped regions. In one embodiment, source and drain regions 504 are composed of phosphorous or arsenic dopant impurity atoms with a concentration in the range of $5 \times 10^{16}$-$5 \times 10^{19}$ atoms/cm$^3$. In accordance with another embodiment of the present invention, channel region 506 is an N-type doped region and source and drain regions 504 are P-type doped regions. In one embodiment, source and drain regions 504 are composed of boron dopant impurity atoms with a concentration in the range of $5 \times 10^{16}$-$5 \times 10^{19}$ atoms/cm$^3$.

Placeholder gate electrode 530 may be composed of any material suitable for patterning and for ultimate selective removal in a replacement gate integration scheme. In one embodiment, placeholder gate electrode 530 is composed of a semiconductor material such as, but not limited to, poly-crystalline silicon, doped poly-crystalline silicon, amorphous silicon, doped amorphous silicon or a silicon-germanium alloy. In another embodiment, placeholder gate electrode 530 is composed of an insulating material such as, but not limited to, silicon dioxide, silicon oxy-nitride or silicon nitride.

Gate dielectric layer 508 may be composed of any material suitable to electrically isolate a gate electrode from substrate 502. In one embodiment, gate dielectric layer 508 is formed by a thermal oxidation process or a chemical vapor deposition process and is composed of a material such as, but not limited to, silicon dioxide or silicon oxy-nitride and has a thickness approximately in the range of 1-5 nanometers. In another embodiment, gate dielectric layer 508 is formed by atomic layer deposition and is composed of a high-k dielectric material such as, but not limited to, hafnium oxide, zirconium oxide, hafnium silicate, hafnium oxy-nitride or lanthanum oxide and has a thickness in approximately in the range of 1-10 nanometers. In a specific embodiment, a thin chemical oxide such as silicon dioxide or silicon oxy-nitride is formed between substrate 502 and the high-k dielectric material. The incorporation of a thin chemical oxide may lead to improved channel mobility. In an alternative embodiment, gate dielectric layer 508 is a placeholder gate dielectric layer and has a thickness sufficiently thick to act as an etch stop during the subsequent removal of placeholder gate electrode 530, yet sufficiently thin for removal with substantial selectivity to dielectric spacers 514 and dielectric layer 512. In a specific alternative embodiment, gate dielectric layer 508 is a placeholder gate dielectric layer composed of silicon dioxide and has a thickness approximately in the range of 2-5 nanometers.

Referring to FIG. 5A, dielectric spacers 514 may optionally be disposed adjacent to the sidewalls of placeholder gate electrode 530. In accordance with an embodiment of the present invention, the inner sidewalls 516 of dielectric spacers 514 will ultimately form the sidewalls of a trench for use in a replacement gate integration scheme. In one embodiment, dielectric spacers 514 are formed by depositing a dielectric layer over placeholder gate electrode 530 and subsequently etching the dielectric layer with an anisotropic etch process, prior to the formation of dielectric layer 512. In a specific embodiment, dielectric spacers 514 are composed of a material which may include, but is not limited to, silicon dioxide, silicon nitride and silicon oxy-nitride.

Dielectric layer 512 may be formed by way of operations associated with a typical replacement gate integration scheme. For example, in one embodiment, source and drain regions are metallized in a silicidation process following the formation of dielectric spacers 514 and source and drain regions 504. Subsequently, an inter-layer dielectric layer is deposited above substrate 502 and above placeholder gate electrode 530. The inter-layer dielectric layer is then planarized to form dielectric layer 512, which enables the exposure of the top surface of placeholder gate electrode 530, as depicted in FIG. 5A. In one embodiment, dielectric layer 512 is composed of a material such as, but not limited to, silicon dioxide or carbon-doped silicon oxide.

Figure 5B:
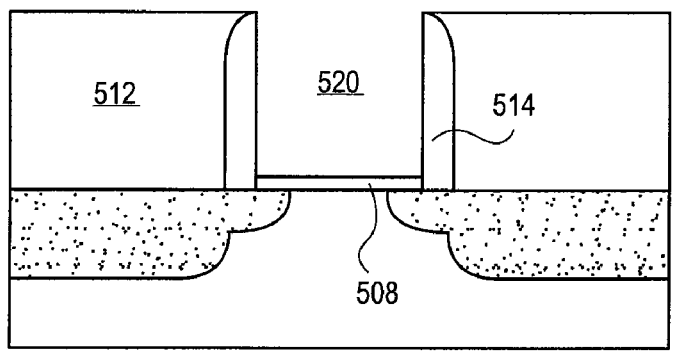
Figure 5B:
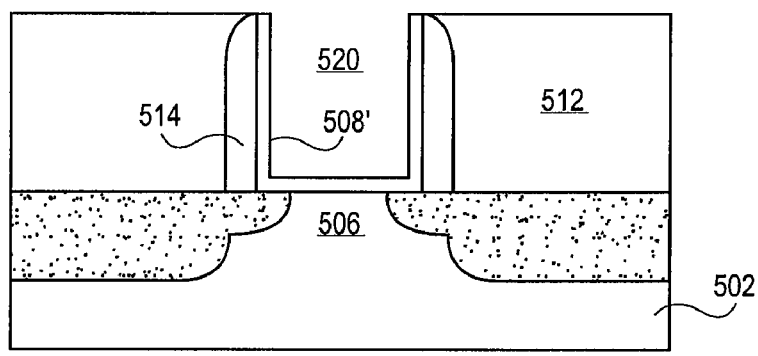

Referring to FIG. 5B, placeholder gate electrode 530 is removed to form a trench 520 disposed in dielectric layer 512 and, in particular, between dielectric spacers 514 and above gate dielectric layer 508. In one embodiment, placeholder gate electrode 530 is removed by a selective etch process such as a dry etch process or a wet etch process, or a combination thereof. In a specific embodiment, gate dielectric layer 508 is used as an etch stop layer in an etch process used to remove placeholder gate electrode 530.

Referring to FIG. 5B', in an alternative embodiment of the present invention, gate dielectric layer 508 from FIG. 5B is a placeholder gate dielectric layer and is also removed subsequent to the removal of placeholder gate electrode 530. A replacement gate dielectric layer 508' may then be formed at the bottom of trench 520 and above channel region 506 in substrate 502. In accordance with an embodiment of the present invention, portions of replacement gate dielectric layer 508' are also disposed along the sidewalls of trench 520 disposed in dielectric layer 512. In one embodiment, trench 520 is defined by the sidewalls of dielectric spacers 514 and, thus, the portions of replacement gate dielectric layer 508' disposed along the sidewalls of trench 520 are directly adjacent to the sidewalls of dielectric spacers 514, as depicted in FIG. 5B'. Replacement gate dielectric layer 508' may be formed by any process and may be composed of any material suitable for depositing in a narrow trench and suitable to electrically isolate a subsequently formed metal gate electrode from substrate 502. In one embodiment, replacement gate dielectric layer 508' is formed by atomic layer deposition and is composed of a high-k dielectric material such as, but not limited to, hafnium oxide, zirconium oxide, hafnium silicate, hafnium oxy-nitride or lanthanum oxide and has a thickness in approximately in the range of 1-10 nanometers. In a specific embodiment, a thin chemical oxide such as silicon dioxide or silicon oxy-nitride is formed between substrate 502 and replacement gate dielectric layer 508'. The incorporation of a thin chemical oxide may lead to improved channel mobility. In an additional specific embodiment, a dielectric interfacial layer is disposed above replacement gate dielectric layer 508' for work-function tuning of a subsequently formed gate electrode and is composed of a material such as, but not limited to aluminum oxide or lanthanum oxide.

Figure 5C:
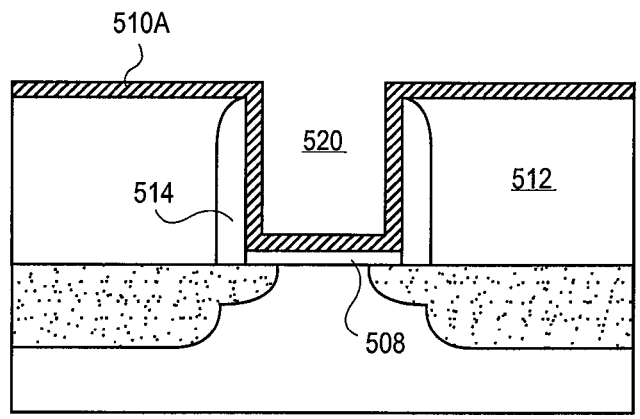

Either of the structures described in association with FIGS. 5B and 5B' may be used for a replacement gate process integration scheme. However, for convenience, further operations of such an integration scheme are discussed herein with respect to a structure such as the one described in association with FIG. 5B. Thus, referring to FIG. 5C, a first work-function-setting film 510A is formed along the sidewalls of trench 520 and at the bottom of trench 520, above gate dielectric layer 508. In accordance with an embodiment of the present invention, first work-function-setting film 510A has a thickness at the bottom of trench 520 substantially equal to the thickness along the sidewalls of trench 520, as depicted in FIG. 5C. In one embodiment, the portions of first work-function-setting film 510A formed along the sidewalls of trench 520 in dielectric layer 512 (as defined by dielectric spacers 514) are directly adjacent to the sidewalls of trench 520, as depicted in FIG. 5C.

First work-function-setting film 510A may be composed of any material and have any dimension described in association with first work-function-setting film 310A from FIG. 3. First work-function-setting film 510A may be deposited by any technique suitable to provide uniform coverage at the bottom of trench 520 above gate dielectric layer 508, without degrading gate dielectric layer 508. In accordance with an embodiment of the present invention, first work-function-setting film 510A is deposited by a chemical vapor deposition process or an atomic layer deposition process. In one embodiment, first work-function-setting film 510A is deposited by a heavy-ion atomic layer deposition process.

Figure 5D:
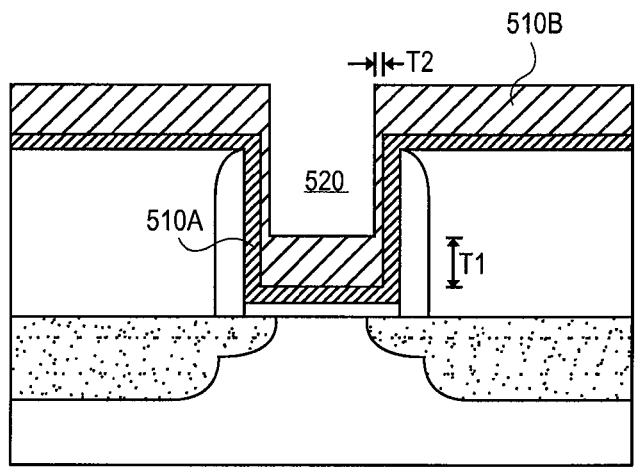

Referring to FIG. 5D, a second work-function-setting film 510B is formed at the bottom of trench 520 above first work-function-setting film 510A. In one embodiment, second work-function-setting film 510B is further formed along the sidewalls of trench 520, adjacent to first work-function-setting film 510A. In a specific embodiment, second work-function-setting film has a thickness at the bottom of trench 520 (T1) greater than the thickness along the sidewalls of trench 520 (T2), as depicted in FIG. 5D. In an alternative embodiment, second work-function-setting film 510B is not formed along the sidewalls of trench 520 and, hence, the thickness T2 is equal to zero.

Second work-function-setting film 510B may be composed of any material and have any dimension described in association with second work-function-setting film 310B from FIG. 3. Second work-function-setting film 510B may be deposited by any technique suitable to provide uniform coverage at the bottom of trench 520 above first work-function-setting film 510A, without substantially closing off the opening of trench 520. In accordance with an embodiment of the present invention, second work-function-setting film 510B is deposited by a physical vapor deposition process. In one embodiment, the sputtering angle used in the physical vapor deposition process is approximately orthogonal to the opening of trench 520. In a specific embodiment, the thickness of material of second work-function-setting film 510B formed along the bottom of trench 520 is at least four time greater than the thickness of material of second work-function-setting film 510B formed along the sidewalls of trench 520. In a particular embodiment, the thickness of material of second work-function-setting film 510B formed along the sidewalls of trench 520 is approximately or less than 10% of the thickness of material of second work-function-setting film 510B formed at the bottom of trench 520. In accordance with an embodiment of the present invention, second work-function-setting film 510B is composed of substantially the same material as first work-function-setting film 510A to provide a work-function-setting layer such as work-function-setting layer 210A, described in association with FIG. 2.

Thus, as described above in accordance with an embodiment of the present invention, a gate electrode of a semiconductor device is fabricated from two work-function-setting films. The first work-function setting film is deposited by a process that is essentially non-impacting to a gate dielectric layer. However, in one embodiment, the process also undesirably forms material along the sidewalls of a trench, which could hinder subsequent complete fill of the trench. The second work-function-setting may then be deposited by a process that deposits substantially more material on the bottom of the trench than along the sidewalls of the trench. In one embodiment, the deposition process used to deposit the second work-function-setting film would otherwise impact a gate dielectric layer, but the first work-function setting film is provided to protect the gate dielectric layer. In one embodiment, the first work-function-setting film is deposited by an atomic layer deposition process and the second work-function-setting film is deposited by a physical vapor deposition process. In a specific embodiment, the first work-function-setting film is formed to a thickness sufficiently thick to protect a gate dielectric layer during the formation of the second work-function-setting film, but sufficiently thin to allow for the second work-function-setting film to contribute to the work-function of a gate electrode.

Figure 5E:
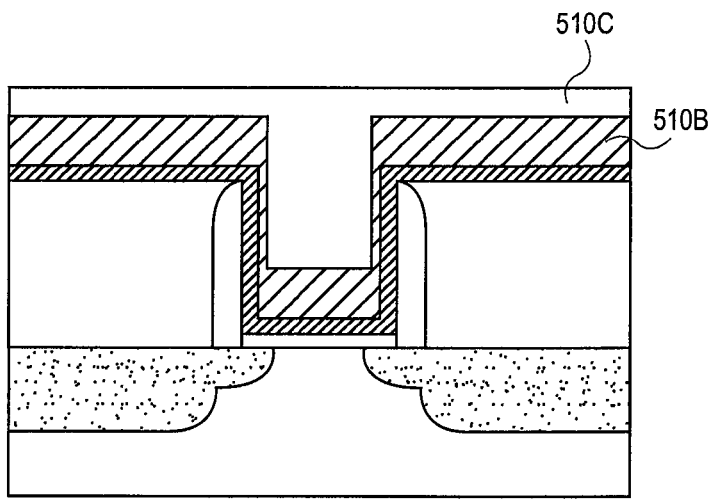

Referring to FIG. 5E, a fill metal layer 510C is formed above second work-function-setting film 510B to essentially or completely fill the remaining open regions of trench 520. In accordance with an embodiment of the present invention, fill metal layer 510C is conductive and an electrical contact is subsequently made to the top surface of fill metal layer 510C. In one embodiment, fill metal layer 510C is composed of a material such as, but not limited to tungsten, aluminum or copper. In a specific embodiment, fill metal layer 510C is composed of multiple layers. For example, in a particular embodiment, fill metal layer 510C is composed of a titanium/titanium nitride barrier layer above second work-function-setting film 510B and a conductive layer formed above the barrier layer. In an embodiment, fill metal layer 510C is composed of physical vapor-deposited titanium nitride having a thickness approximately in the range of 7-9 nanometers above second work-function-setting film 510B, followed by physical vapor-deposited titanium having a thickness approximately in the range of 7-9 nanometers, followed by an aluminum seed layer having a thickness approximately in the range of 45-55 nanometers, and followed by a reflow-deposited aluminum layer having a thickness approximately in the range of 190-210 nanometers. In another specific embodiment, fill metal layer 510C is composed of aluminum or a layer of aluminum and is used to diffuse aluminum atoms into underlying work-function setting films for work-function tuning.

Figure 5F:
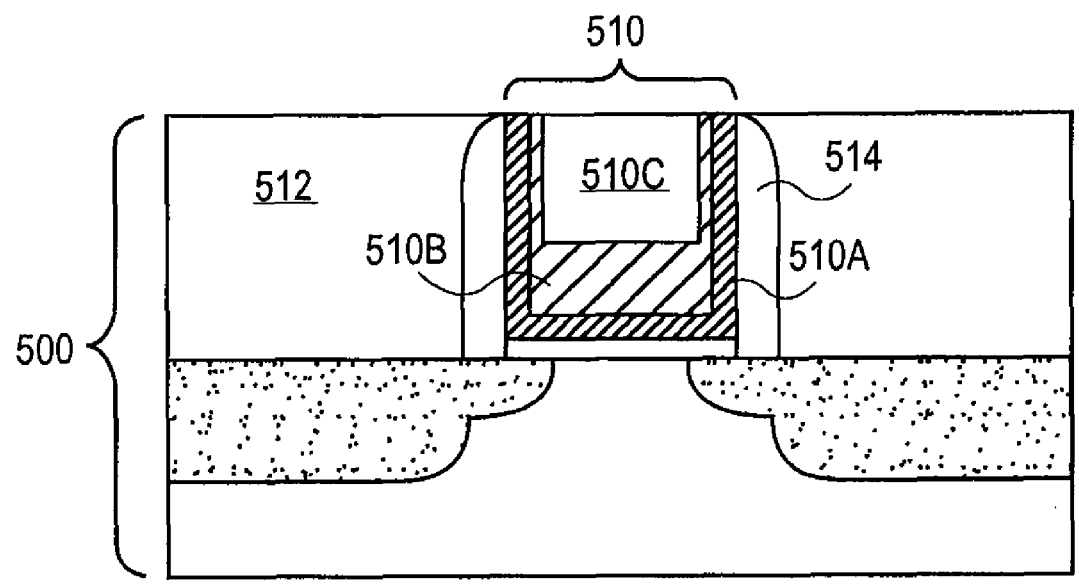
Figure 5F:
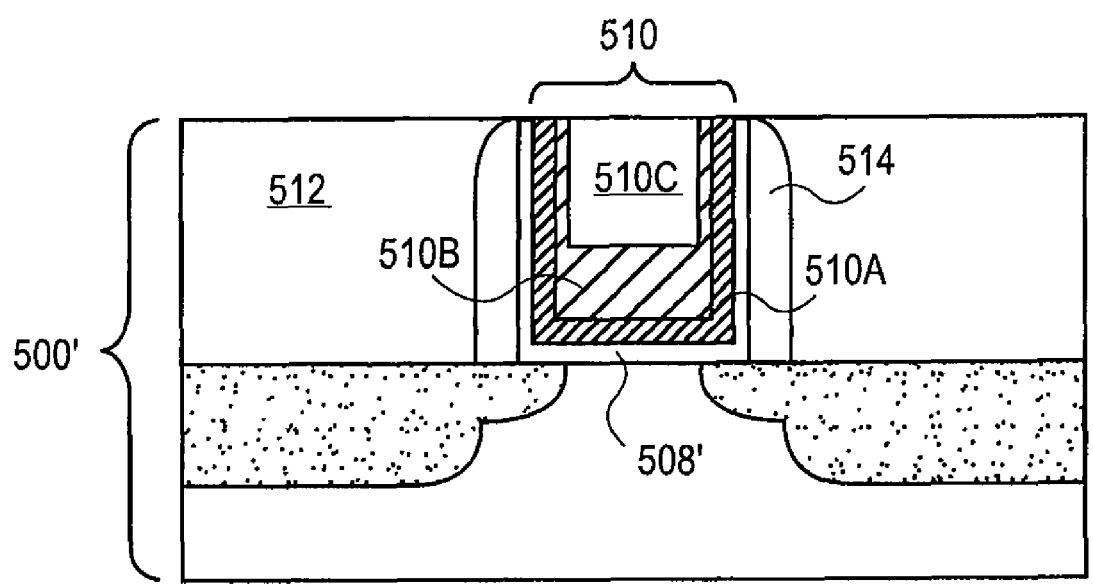

Referring to FIG. 5F, all portions of first work-function-setting film 510A, second work-function-setting film 510B, and fill metal layer 510C above the top surface of dielectric layer 512 are removed to provide a gate electrode 510 in semiconductor device 500. Gate electrode 510 is thus formed directly between the sidewalls of trench 520 in dielectric layer 512 and, in particular, between the sidewalls of dielectric spacers 514. The portions of first work-function-setting film 510A, second work-function-setting film 510B, and fill metal layer 510C above the top surface of dielectric layer 512 may be removed by any technique suitable to essentially or completely remove these portions with high selectivity to dielectric layer 512. In one embodiment, these portions are removed by a chemical-mechanical polish process. In accordance with an embodiment of the present invention, gate dielectric layer 508 has a thickness in the range of 1-3 nanometers and is composed of a hafnium oxide layer above a chemical silicon dioxide layer, first work-function-setting film 510A is composed of an atomic layer-deposited tantalum nitride layer having a thickness in the range of 1-2 nanometers, second work-function-setting film 510B is composed of a physical vapor-deposited tantalum nitride layer having a thickness in the range of 4-6 nanometers, and fill metal layer 510C is composed of a physical vapor-deposited titanium nitride layer having a thickness approximately in the range of 7-9 nanometers above second work-function-setting film 510B, a physical vapor-deposited titanium layer having a thickness approximately in the range of 7-9 nanometers, an aluminum seed layer having a thickness approximately in the range of 45-55 nanometers, and a top reflow-deposited aluminum layer having a thickness approximately in the range of 190-210 nanometers.

In an alternative embodiment, gate dielectric layer 508' is a replacement gate dielectric layer, as described in association with FIG. 5B'. In one embodiment, the material of replacement gate dielectric layer 508' is also formed above dielectric layer 512 during an atomic layer deposition process used to deposit replacement gate dielectric layer 508'. Referring to FIG. 5F', all portions of replacement gate dielectric layer 508', first work-function-setting film 510A, second work-function-setting film 510B, and fill metal layer 510C above the top surface of dielectric layer 512 are removed to provide a gate electrode 510 in semiconductor device 500'. Gate electrode 510 is thus formed directly between the portions of replacement gate dielectric layer 508' formed along the sidewalls of trench 520 in dielectric layer 512. The portions of replacement gate dielectric layer 508', first work-function-setting film 510A, second work-function-setting film 510B, and fill metal layer 510C above the top surface of dielectric layer 512 may be removed by any technique suitable to essentially or completely remove these portions with high selectivity to dielectric layer 512. In one embodiment, these portions are removed by a chemical-mechanical polish process.

Semiconductor device 500 or 500' fabricated by operations described in association with FIG. 5A-5F or 5F' may be any semiconductor device compatible with a replacement gate integration scheme. For example, in accordance with an embodiment of the present invention, semiconductor device 500 or 500' is a device such as, but not limited to, a planar MOS-FET, a memory transistor or a Microelectromechanical System (MEMS). In one embodiment, semiconductor device 500 or 500' is a planar MOS-FET and is an isolated device or is one device in a plurality of nested devices. As will be appreciated for the typical integrated circuit, both N- and P-type transistors may be fabricated on a single substrate to form a CMOS integrated circuit.

Thus, metal gate electrodes for a replacement gate integration scheme have been disclosed. In accordance with an embodiment of the present invention, a semiconductor device includes a substrate having a dielectric layer disposed thereon. A trench is disposed in the dielectric layer. A gate dielectric layer is disposed at the bottom of the trench and above the substrate. A gate electrode has a work-function-setting layer disposed along the sidewalls of the trench and above the gate dielectric layer at the bottom of the trench. The work-function-setting layer has a thickness at the bottom of the trench greater than the thickness along the sidewalls of the trench. A pair of source and drain regions is disposed in the substrate, on either side of the gate electrode. In one embodiment, the portion of the work-function-setting layer disposed along the sidewalls of the trench is directly adjacent to the sidewalls of the trench. In another embodiment, the gate dielectric layer is further disposed along the sidewalls of the trench and the portion of the work-function-setting layer disposed along the sidewalls of the trench is adjacent to the gate dielectric layer.

What is claimed is:

1. A method for fabricating a semiconductor device, comprising:
   providing a substrate having a dielectric layer disposed thereon;
   forming a trench in said dielectric layer;
   providing a gate dielectric layer at the bottom of said trench and above said substrate;
   forming a first work-function-setting film of a gate electrode above said gate dielectric layer at the bottom of said trench, wherein said first work-function-setting film is further formed along the sidewalls of said trench, and wherein said first work-function-setting film has a thickness at the bottom of said trench approximately equal to its thickness along the sidewalls of said trench; and
   forming a second work-function-setting film of said gate electrode above said first work-function-setting film at the bottom of said trench, wherein said second work-function-setting film is further formed adjacent to said first work-function-setting film along the sidewalls of said trench, and wherein said second work-function-setting film has a thickness at the bottom of said trench greater than its thickness adjacent to said first work-function-setting film along the sidewalls of said trench.

2. The method of claim 1, wherein forming said first work-function-setting film includes depositing said first work-function-setting film by an atomic layer deposition process, and wherein forming said second work-function-setting film includes depositing said second work-function-setting film by a physical vapor deposition process.

3. The method of claim 2, wherein said first work-function-setting film is formed to a thickness sufficiently thick to protect said gate dielectric layer during the forming of said second work-function-setting film, but sufficiently thin for said second work-function-setting film to contribute to the work-function of said gate electrode.

4. The method of claim 1, wherein providing said gate dielectric layer includes forming said gate dielectric layer prior to forming said trench, and wherein forming said trench includes exposing said gate dielectric layer.

5. The method of claim 1, wherein providing said gate dielectric layer includes forming said gate dielectric layer after forming said trench and prior to forming said first work-function-setting film, and wherein said gate dielectric layer is further formed along the sidewalls of said trench.

6. The method of claim 1, wherein said gate dielectric layer has a thickness in the range of 1-3 nanometers and comprises a hafnium oxide portion above a chemical silicon dioxide portion, wherein said first work-function-setting film comprises an atomic layer-deposited tantalum nitride layer having a thickness in the range of 1-2 nanometers, and wherein said second work-function-setting film comprises a physical vapor-deposited tantalum nitride layer having a thickness in the range of 4-6 nanometers.

7. The method of claim 1, wherein a fill metal layer fills the remainder of the trench, above said second work-function-setting film.

* * * * *